United States Patent [19]

Terui et al.

[11] Patent Number: 5,544,617
[45] Date of Patent: Aug. 13, 1996

[54] METHOD FOR PRODUCING SINGLE CRYSTAL, AND NEEDLE-LIKE SINGLE CRYSTAL

[75] Inventors: Yoshinori Terui; Ryuichi Terasaki, both of Machida, Japan

[73] Assignee: Denki Kagaku Kogyo Kabushiki Kaisha, Tokyo, Japan

[21] Appl. No.: 422,167

[22] Filed: Apr. 14, 1995

Related U.S. Application Data

[62] Division of Ser. No. 63,721, May 20, 1993, abandoned.

[30] Foreign Application Priority Data

May 22, 1992 [JP] Japan .................................. 4-154118

[51] Int. Cl.$^6$ .................................................. C30B 25/04
[52] U.S. Cl. .............................. 117/87; 117/75; 117/921
[58] Field of Search .......................... 117/75, 87, 95, 117/921, 931, 939; 427/248.1, 250

[56] References Cited

U.S. PATENT DOCUMENTS

| 3,721,732 | 3/1973 | Fenberg et al. | 117/75 |
| 4,155,781 | 5/1979 | Diepers | 117/75 |
| 4,888,084 | 12/1989 | Nixdorf et al. | 117/75 |
| 5,160,574 | 11/1992 | Pearson et al. | 117/75 |
| 5,314,569 | 5/1994 | Pribat et al. | 117/75 |

OTHER PUBLICATIONS

Zaima et al, *J. Phys. D: Appl. Phys.*, vol. 13, pp. L47–49 (1980).

*Primary Examiner*—Felisa C. Garrett
*Attorney, Agent, or Firm*—Oblon, Spivak, McClelland, Maier & Neustadt, P.C.

[57] ABSTRACT

A method for producing a single crystal, which comprises (1) placing a metal layer as a pattern at a desired position on the surface of a single crystal substrate, (2) etching the surface of the single crystal substrate around the pattern, and (3) in a raw material gas atmosphere containing an element or elements constituting the single crystal, taking the element or elements in the metal layer at the pattern and permitting a needle-like single crystal to grow perpendicularly.

19 Claims, 5 Drawing Sheets

(a)

(b)

(a)

(b)

(b')

(c)

(d)

(e)

(e')

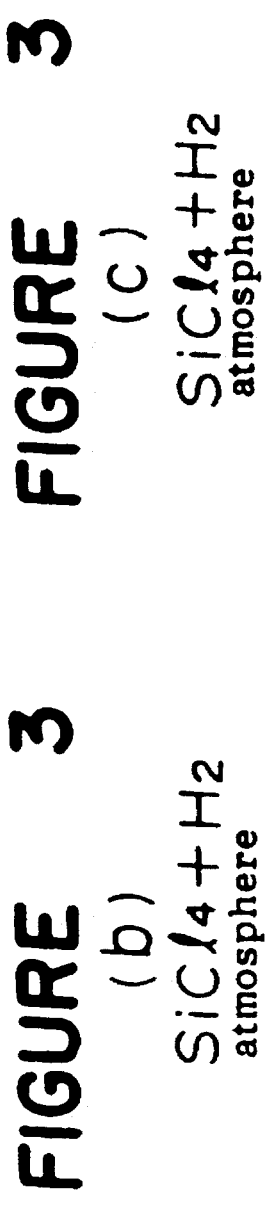
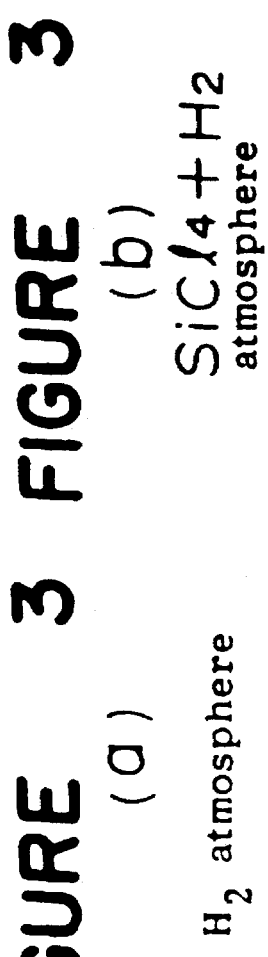
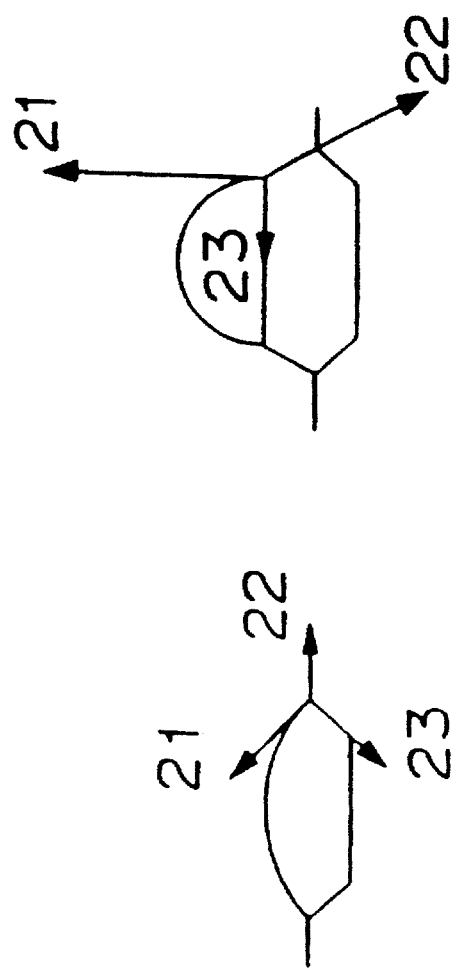
FIGURE 3 (a)
$H_2$ atmosphere
FIGURE 3 (b)
$SiCl_4 + H_2$ atmosphere
FIGURE 3 (c)
$SiCl_4 + H_2$ atmosphere FIGURE 4
(a)
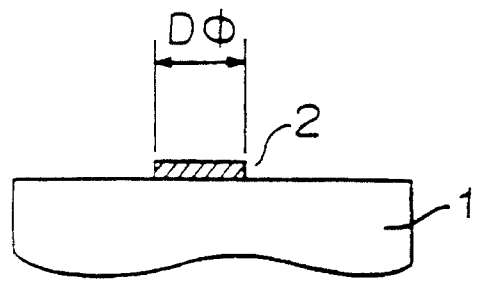
FIGURE 4
(b)
FIGURE 4
(c)
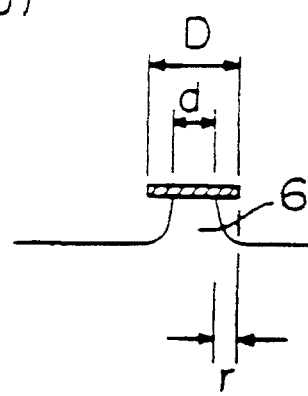 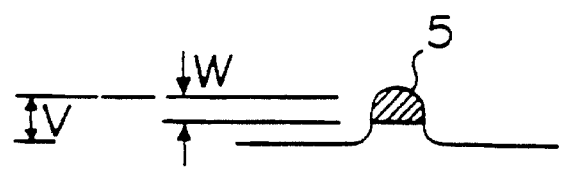
FIGURE 4
(d)
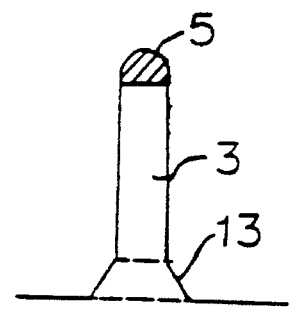
FIGURE 4
(e)
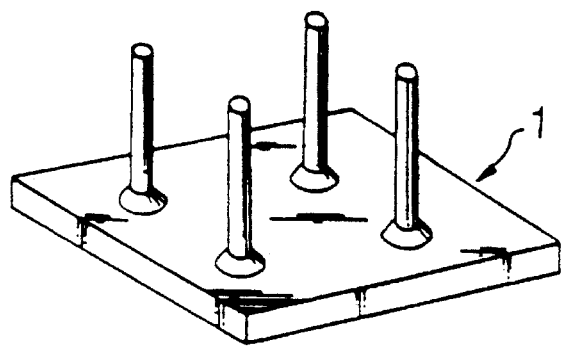

METHOD FOR PRODUCING SINGLE CRYSTAL, AND NEEDLE-LIKE SINGLE CRYSTAL

This is a continuation of application Ser. No. 08/063,721 filed on May 20, 1993, now abandoned.

BACKGROUND OF THE INVENTION

1. Field of the Invention

The present invention relates to a method for producing a single crystal grown perpendicularly at a desired position and a needle-like single crystal thereby produced, which is useful as a probe pin for measuring electrical characteristics of semiconductor integrated circuits, or as a probe for a microvacuum device or an electron gun or for scanning probe microscopes including a scanning tunnel microscope and an atomic force microscope.

2. Discussion of Background

Firstly, to facilitate the understanding of the present invention, a method for forming a needle-like crystal at a desired position on a substrate will be described, which constitutes a background technology of the present invention. This method is the one disclosed by R. S. Wagner and W. C. Ellis in Appl. Phys. Letters 4 (1964) 89. FIG. 1 is drawings to illustrate such a method for forming a needle-like crystal. As shown in FIG. 1(a), layers 2 of Au are placed at predetermined positions on a silicon single crystal substrate 1 with the surface being a (111) face. Then, this assembly is heated in a gas atmosphere containing silicon such as $SiH_4$ or $SiCl_4$ at a temperature higher than the melting point of a Si—Au alloy. A Si—Au alloy has a low melting point, and droplets of this alloy will accordingly be formed at the positions where the layers 2 of Au are placed. Here, silicon will be taken in from the atmosphere by the thermal decomposition of the gas. Since the liquid-state material takes in silicon atoms more readily than other solid state materials, the silicon content in the droplets of the Si—Au alloy will gradually become excessive. This excess silicon will undergo epitaxial growth on the silicon substrate 1, whereby as shown in FIG. 1(b), needle-like crystals 3 will grow along a <111> axial direction while having Si—Au alloy droplets 5 at the top. Further, each needle like crystal 3 is a single crystal and thus has the same crystal orientation as that of the substrate 1. Further, the diameter of the needle-like crystal 3 is substantially the same as the diameter of the droplet. The foregoing mechanism for crystal growth is called VLS (vapor-liquid-solid) growth and will be hereinafter referred to simply as VLS growth.

This method is applied not only to the growth of a silicon single crystal but also to the growth of other single crystals. For example, a $LaB_6$ single crystal has a high melting point at a level of 2,530° C., a high evaporation rate and a high reactivity and therefore is not suitable for a molten liquid crystal growth. From such a viewpoint, VLS growth capable of conducting crystal growth at a low temperature has been attempted for a $LaB_6$ single crystal (Journal of Crystal Growth 51 (1981) 190–194). Using a $LaB_6$ single crystal substrate as the substrate, it is possible to form columnar crystals of $LaB_6$ by patterning Au dots on the substrate. However, it is difficult to accurately form one columnar single crystal at one Au dot pattern, and the aspect ratio (thickness of Au/diameter of the pattern) must be at least 0.05. Even then, it is unavoidable that fine crystals will form around the central needle-like crystal (Journal of the Less-common Metals, 117 (1986) 97–103).

There are the following problems when single crystals are to be formed by the above described VLS growth method.

(1) When the aspect ratio (thickness/diameter) of a pattern (e.g. a spot-like pattern) is small, it is difficult to form one single crystal at one pattern, and a plurality of needle-like crystals or a bunch of fine needle-like crystals will be formed which are undesirable for forming a single crystal at a desired position on a substrate. (2) The positions of single crystals formed are likely to be dislocated from the initial positions of the corresponding patterns, and in an extreme case, the adjacent Au patterns are likely to contact each other during the formation of the Au—Si alloy, whereby a fusion phenomenon takes place where a plurality of patterns fuse to one another to form one pattern. (3) Needle-like single crystals grown corresponding to the individual patterns undergo kinking (bending) or branching (separation) during the growth.

SUMMARY OF THE INVENTION

The present invention has been made in view of the above-mentioned problems. Therefore, it is an object of the present invention to provide a method for producing a single crystal grown perpendicularly at a desired position on a single crystal substrate, and a needle-like single crystal thereby produced.

The present invention provides a method for producing a single crystal, which comprises (1) placing a metal layer as a pattern at a desired position on the surface of a single crystal substrate, (2) etching the surface of the single crystal substrate around the pattern, and (3) in a raw material gas atmosphere containing an element or elements constituting the single crystal, taking the element or elements in the metal layer at the pattern and permitting a needle-like single crystal to grow perpendicularly.

The present invention also provides a needle-like single crystal comprising (1) a base portion made of a single crystal, (2) a needle-like single crystal portion and (3) a metal layer portion at the forward end, arranged in this order perpendicularly at a desired position on an etching-treated surface of a single crystal substrate.

BRIEF DESCRIPTION OF THE DRAWINGS

FIGS. 3(a) to 3(b) illustrate the principle of the present invention.

FIG. 4(a) to 4(b) illustrate the steps of the method of the present invention.

DETAILED DESCRIPTION OF THE PREFERRED EMBODIMENTS

Figure 1:
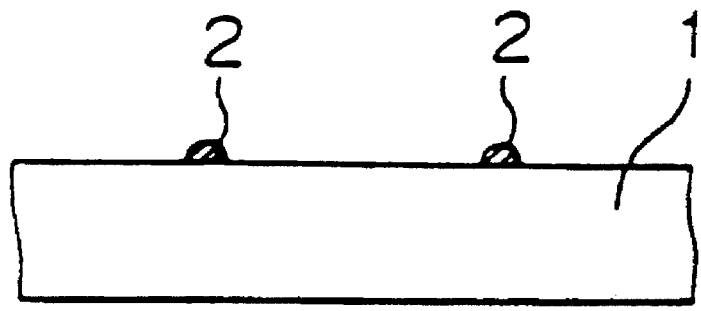
FIGS. 1(a) to 1(b) illustrate the process steps of the conventional VLS growth method.
Figure 1:
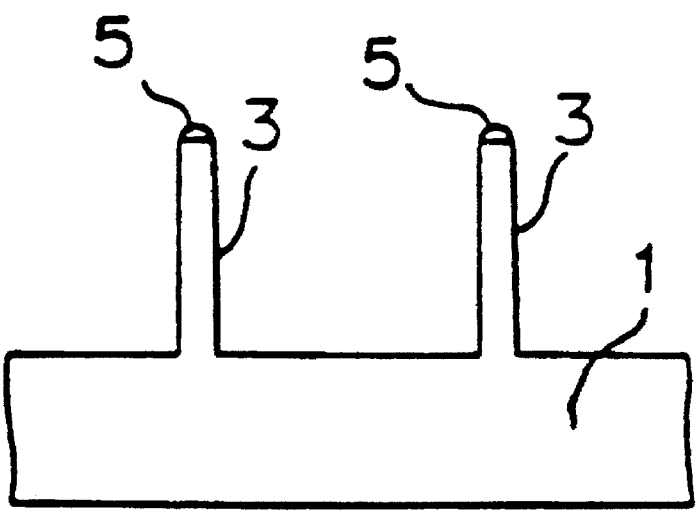

The single crystal substrate to be used in the present invention may, for example, be a substrate having a single crystal of e.g. Si, $LaB_6$, Ge, $\alpha\text{-}Al_2O_3$, GaAs, GaP, MgO, NiO or SiC present at its surface in a thickness of at least 3 μm and having a thin film of a uniform thickness or a thin film in a pattern of e.g. spots formed thereon. The thickness of the single crystal substrate is usually at most 5 mm, although there is no particular upper limit in the thickness. Specifically, a single crystal substrate of e.g. Si or LaB$_6$, a SOI substrate and a SIMOX substrate are particularly preferred. The SOI substrate may, for example, be a substrate prepared by laminating a single crystal Si layer on the surface of a single crystal substrate having an insulating property such as SiO$_2$, Sapphire ($\alpha$-Al$_2$O$_3$) or spinel (MgAlO$_3$) by a heat treatment method, or by forming a Si single crystal film on the surface of such an insulating substrate. The SIMOX substrate may, for example, be a substrate prepared by injecting oxygen ions into a single crystal Si substrate to form an oxidized region immediately beneath the single crystal region.

The needle-like single crystal of the present invention is preferably arranged perpendicularly on the single crystal substrate surface, but it may not necessarily be arranged perpendicularly. However, it is preferred that the angle $\theta$ of the needle-like single crystal to the normal line of the substrate is within a range of not more than 20°.

The needle-like single crystal of the present invention has the same crystal orientation as that of the substrate. Accordingly, when the needle-like crystal is to be formed at a certain angle to the normal line of the substrate surface, a substrate cut out at the same angle to the normal line of the substrate surface, is used.

As the metal forming the metal layer placed as a pattern at the desired position on the surface of the single crystal substrate in the present invention, a metal capable of forming an alloy with the element or elements constituting the needle-like single crystal, or a metal having a melting point lower than the needle-like single crystal, can be used. Such a metal is the one capable of forming a liquid droplet on the substrate. Specifically, it may, for example, be Au, Pt, Ag, Cu, Pd or Ga. Particularly preferred is Au or Pt. There is no particular restriction as to the shape of the pattern of the metal layer. Specifically, however, it is usually a circular shape, an oval shape, a rectangular shape or a polygonal shape. Formation of such a pattern is conducted by a proper combination of e.g. a photolithographic method, a plating method, a vapor deposition method and an etching method. When the shape of the pattern is circular or substantially circular, the diameter of the pattern is usually from 1 to 300 μm. The aspect ratio (thickness of the pattern/diameter of the pattern) is preferably within a range of from 0.01 to 10.

As a solution to be used for the wet system etching treatment of the present invention, a common solution for etching treatment can be used. Specifically, an acid or alkali solution can be used. Usually, a HF solution is used.

The degree of etching in the present invention is usually from 1 to 100 μm, preferably from 2 to 50 μm, in consideration of the positional precision, kinking and branching. The tapered portion formed by the etching is preferably a trapezoid for the stability in the single crystal growth.

The needle-like single crystal of the present invention may be the one capable of being formed by VLS growth. Specifically, it may, for example, be Si, LaB$_6$, Ge, $\alpha$-Al$_2$O$_3$, GaAs, GaP, MgO, NiO or SiC. Particularly preferred is Si or LaB$_6$. In a case where the shape of the needle-like single crystal is circular or substantially circular, the diameter is usually from 1 to 300 μm, and the aspect ratio (height of the needle-like single crystal/diameter of the needle-like single crystal) is usually from 1 to 500. If a needle-like single crystal having an aspect ratio of more than 500 is produced, kinking and branching occur substantially, such being undesirable.

The method for producing a single crystal and the needle-like single crystal of the present invention will be described in further detail with reference to Examples.

Figure 2:
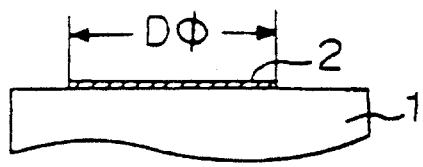
FIGS. 2(a), (b), (b') (c), (d), (e) and (e') illustrate the steps of growth of a single crystal by the conventional VLS growth method.
Figure 2:
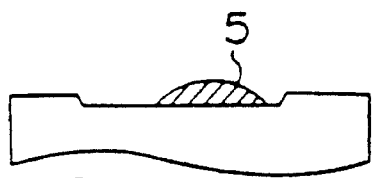
Figure 2:
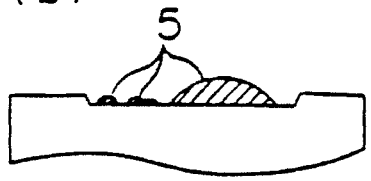
Figure 2:
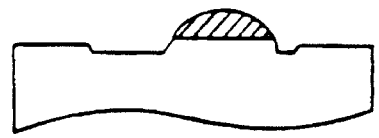
Figure 2:
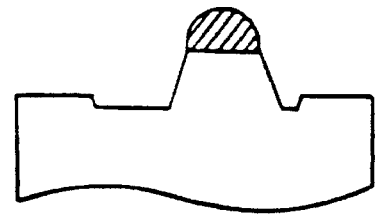
Figure 2:
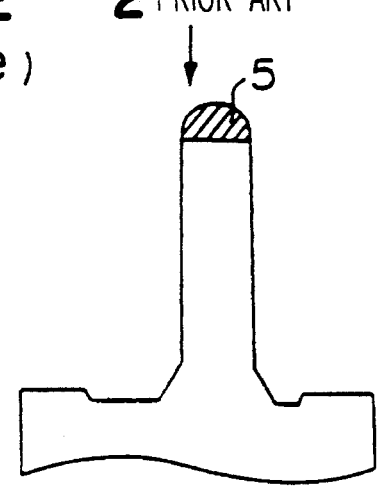
Figure 2:
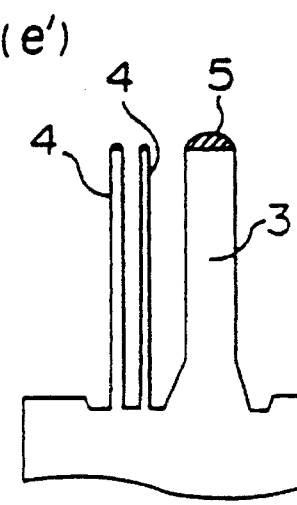

FIG. 2 illustrates the steps of growth of a single crystal by the conventional VLS growth method. Hereinafter, the principle will be explained with respect to a case where the pattern is a spot-like pattern. FIG. 2(a) is a cross section showing a Si substrate 1 on which a thin film of the Au is formed in a spot-like pattern. Here, the diameter of the Au pattern 2 is designated as D. When this substrate is heated in a hydrogen atmosphere at a temperature higher than the eutectic point of Au and Si, the Au pattern and the Si substrate will mutually melt at the contacted portion to form a liquid droplet 5, as shown in FIG. 2(b).

Here, the Au—Si alloy liquid forms a liquid droplet of the size and shape, corresponding to its volume by the weight and the surface tension without wettably spreading on the Si substrate with the original size of the Au pattern having a diameter of D. However, the center position of this droplet is likely to be dislocated from the center of the Au pattern in many cases. Further, when the Au—Si alloy fuses to form a liquid droplet, it sometimes happens that the alloy is separated to form a plurality of liquid droplets instead of forming a single liquid droplet, as shown in FIG. 2(b').

In this state, if e.g. a gas mixture of silicon tetrachloride and hydrogen is introduced, the efficiency in the reduction reaction is extremely high at the surface of the Au—Si alloy liquid as compared with at other solid surface, whereby Si is taken in the Au—Si alloy liquid, and Si in the liquid droplet will be a supersaturated state. Consequently, as shown in FIGS. 2(c) to 2(d), Si precipitates on the Si substrate surface in contact with the Au—Si alloy droplet to form solid Si in a tapered shape below the Au—Si alloy droplet. If precipitation of Si proceeds further, formation of a tapered portion terminates as shown in FIG. 2(e) and the Au—Si alloy droplet will be substantially semi-spherical and continue to precipitate needle-like Si, whereby the needle-like single crystal will continue to grow. However, from the Au pattern accompanied by fine droplets as shown in FIG. 2(b'), the main crystal growth will be accompanied by growth of fine needle-like crystals as shown in FIG. 2(e'), such being undesirable.

The majority of the above-mentioned kinking or branching takes place at the stage of formation of the tapered portion for the following reason. In the VLS growth, the change in the shape from the tapered portion to the needle-like shape is governed by the balance of the surface tension among the gas phase, the liquid phase and the solid phase, as shown in FIG. 3. The surface tension varies depending upon the gas phase composition, the temperature, the pressure, the liquid phase composition, the solid phase composition and, if the solid phase is a single crystal, its orientation. Thus, in FIGS. 3(a) and 3(c), the surface tension is balanced ($\vec{\gamma}VL + \vec{\gamma}VS + \vec{\gamma}LS = 0$), and at the stage of formation of the tapered portion shown in FIG. 3(b), the surface tension is not balanced (($\vec{\gamma}VL + \vec{\gamma}VS + \vec{\gamma}LS \neq 0$), whereby the Au—Si alloy droplet is in a very unstable state. If a certain external disturbance is imparted, kinking or branching will occur.

Therefore, it is practically impossible to grow a plurality of needle-like single crystals accurately at desired positions on a Si single crystal substrate by the conventional VLS growth method.

Now, a method for growing a needle-like single crystal at a desired position on a Si single crystal substrate by the VLS growth method of the present invention will be described. As shown in FIG. 4(a), a pattern of Au with a diameter of D is formed on a Si single crystal substrate. Then, using this Au pattern as a mask, the portion other than the Au pattern is engraved by etching. Here, if a wet-type etching method such as a spray type is used, even the portion immediately below the peripheral portion of the mask can be removed by etching to form a shape as shown in FIG. 4(b), whereby a tapered portion 6 is formed. If properly controlled, this is preferred for the reason which will be described hereinafter.

When heated at a temperature of 950° C., Au and Si melt into each other to form an Au—Si alloy liquid droplet 5 as shown in FIG. 4(c). Here, Si is alloyed, the amount of alloy is determined by the equilibrium composition which is determined by the absolute amount of Au at the Au pattern and the temperature. From the Au—Si phase diagram, the composition of the Au—Si alloy liquid phase at 950° C. is composed substantially of 48% of Au and 52% of Si in the atomic ratio. The diameter D and the thickness t of the Au pattern are preliminarily known. On the other hand, the etching depth v of the Si substrate and the corresponding undercut degree r can also be measured experimentally. Therefore, it is desirable that the etching depth v of the Si substrate is taken larger than the Si alloyed depth W during the formation of the Au—Si alloy liquid droplet, and the diameter and the film thickness of the Au pattern and the etching depth are preliminarily adjusted so that the shape of the Au—Si alloy liquid droplet 5 formed at the tapered portion 6 would be as close as possible to the shape during the constant growth in the VLS growth i.e. to the shape (substantially semi-spherical) of the liquid droplet 5 during the needle-like crystal growth as shown in FIG. 4(d). Namely, it is desirable to conduct treatment so that the diameter d at the top of the tapered portion would be as close as possible to the diameter of the crystal growing in a columnar shape.

The needle-like single crystal of the present invention is formed in such a manner that a base portion 13 is first formed on the substrate by the etching treatment of the single crystal substrate and the liquid droplet formation, as shown at 5 in FIG. 4(d), and a needle-like single crystal portion 3 is then formed thereon. As such a base portion, the one having a shape of a polygonal trapezoid is usually formed. Needle-like single crystals of the present invention are characterized in that they are arranged perpendicularly precisely at the desired positions on the surface of a single crystal substrate, as shown in FIG. 4(e). When a plurality of needle-like single crystals are arranged on a substrate, the distance between the centers of the respective needle-like single crystals is preferably at least 5 μm. According to the present invention, the positional dislocation between the center of the metal layer of the initial pattern and the center of the grown needle-like single crystal is within 10 μm.

The needle-like single crystal obtained by the present invention may be used for e.g a probe pin for measuring electrical characteristics f integrated circuits, by forming a hardly oxidizable metal conductive film of e.g. Au on the surface of this single crystal and a circuit pattern connected to the conductive film formed on the surface.

Such a probe pin is superior to the conventional probe pin having a needle-like measuring terminal of e.g. tangusten for measuring electrical characteristics of e.g. circuit elements during the production of semiconductor integrated circuits in that the shape and the mutual distance of the terminals can be remarkably refined, and formation of multiterminals is possible.

Now, the present invention will be described in further detail with reference to Examples. However, it should be understood that the present invention is by no means restricted by such specific Examples.

EXAMPLE 1

Figure 5:
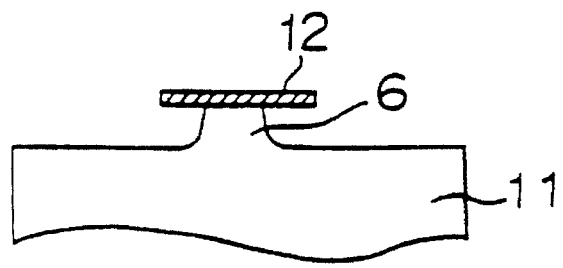
FIG. 5 illustrates a part of the process in Example 1 of the present invention.

On a silicon single crystal substrate 11 having a thickness of 500 μm with a <111> orientation, a number of Au patterns were formed in a lattice form by such methods as photolithography, etching and plating. Each of the formed Au patterns 12 had a diameter of 30 μm and a thickness of 2 μm, and the pitch distance among the Au patterns was 50 μm as shown in FIG. 5. Needle-like single crystals were formed at the positions of these Au patterns by the process which will be described below.

Using these Au patterns as masks, the Si single crystal of the substrate was removed by etching in a depth of 10 μm. Here, a spray system (wet system) etching method was employed, and the undercut by etching was controlled to be 7 μm. As a result, the diameter at the top of Si remaining at the tapered portion 6 was 16 μm. The substrate having a number of Au patterns thus formed, was heated to a temperature of 950° C. in a reaction tube, and a gas mixture of silicon tetrachloride and hydrogen (molar ratio of silicon tetrachloride/hydrogen gas=0.02) was supplied to form needle-like single crystals perpendicularly at the positions of the Au patterns. The needle-like single crystals thus formed were examined by a scanning electron microscope (2,000 magnifications), whereby each needle-like single crystal was found to consist of a base portion, a needle-like single crystal portion and a forward metal layer portion and had a diameter of 16 μm and a height of 500 μm. No formation of fine needle-like single crystals were observed, and the positions of the formed needle-like crystals were the same as the positions of the respective Au patterns initially formed, and the positional dislocation was 1 μm at the maximum. Further, no kinking, branching or fusion of the adjacent Au—Si patterns was observed.

EXAMPLE 2

By a wafer-laminating method, a SOI substrate of 1,000 μm in the thickness having a 2 μm $SiO_2$ insulating layer interposed between silicon single crystal layers was prepared. The silicon layer at the top of this SOI substrate was removed by such a method as mechanical polishing or etching to leave a silicon layer having a thickness of 10 μm. On this substrate, Au patterns were formed by such methods as photolithography, etching and plating. Each of the formed Au patterns had a diameter of 30 μm and a thickness of 2 μm. Needle-like single crystals were formed at the positions of these Au patterns by the process as described below.

Using these Au patterns as masks, the Si single crystal thin film on the substrate was removed by etching to a depth of 10 μm.

Here, a spray system (wet system) etching method was employed, whereby the undercut by etching was controlled to be 7 μm. As a result, the diameter of silicon remaining at the base portion was 16 μm.

The SOI substrate having a number of Au patterns thus formed, was heated to 950° C. in a reaction tube, and a gas mixture of silicon tetrachloride and hydrogen (molar ratio of silicon tetrachloride/hydrogen gas=0.02) was supplied, whereby needle-like single crystals were formed perpendicularly at the positions of the Au patterns. The needle-like single crystals thus formed were observed by a scanning electron microscope (2,000 magnifications), whereby each single crystal was found to consist of a base portion, a needle-like single crystal portion and a forward metal layer portion and had a diameter of 16 μm and a height of 600 μm. No formation of fine needle-like single crystals were observed around them, and the positions of the formed needle-like single crystals were the same as the positions of the respective Au patterns initially formed, and the positional dislocation was 1 μm at the maximum. No kinking, branching or fusion of the adjacent Au—Si patterns was observed.

EXAMPLE 3

A sapphire substrate having a thickness of 500 μm was heated to 1,000° C. in a reaction tube, and a gas mixture of monosilane and hydrogen was supplied to form a silicon single crystal film having a thickness of 30 μm on the sapphire substrate. On this SOI substrate, Au patterns were formed by such methods as photolithography, etching and plating. Each of the formed Au patterns had a diameter of 70 μm and a thickness of 3 μm. Needle-like single crystals were formed at the positions of such Au patterns by the process which will be described below.

Using these Au patterns as masks, the Si single crystal thin film on the substrate was removed by wet system etching to a depth of 20 μm.

Here, the undercut by etching was 20 μm, and the diameter at the top of Si remaining at the base portion was 30 μm.

The substrate having Au patterns thus formed, was heated in a reaction tube, and a gas mixture of silicon tetrachloride and hydrogen (molar ratio of silicon tetrachloride/hydrogen gas=0.02) was supplied, whereby needle-like single crystals were formed perpendicularly at the positions of the Au patterns. The needle-like single crystals thus formed were examined by a scanning electron microscope (2,000 magnifications), whereby each single crystal was found to consist of a base portion, a needle-like single crystal portion and a forward metal layer portion and had a diameter of 30 μm and a height of 500 μm. No formation of fine needle-like single crystals was observed around them. Further, the positions of the formed needle-like single crystals were the same as the positions of the respective Au patterns initially formed, and the positional dislocation was 1 μm at the maximum. No kinking or branching was observed.

EXAMPLE 4

Figure 6:
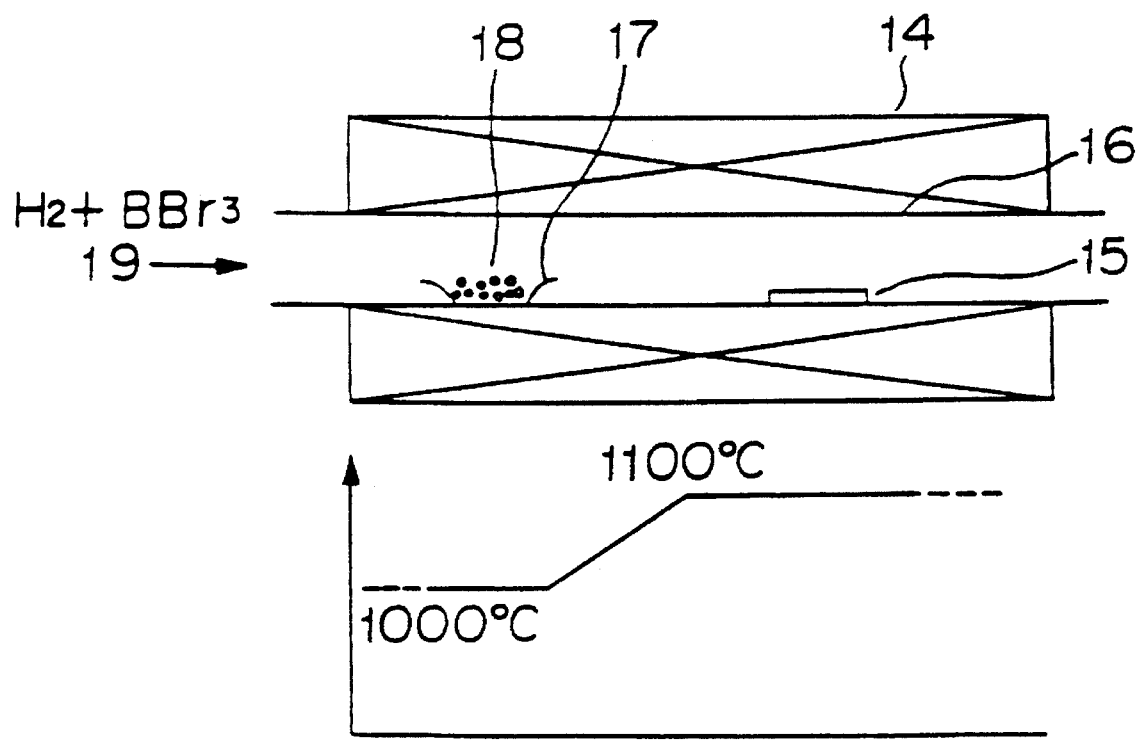
FIG. 6 is a view showing the apparatus used in Example 4.

AU was deposited by vacuum evaporation in a thickness of 0.04 μm on a $LaB_6$ single crystal having a thickness of 1,000 μm with <100> orientation, and Au patterns each having a diameter of 30 μm were formed by photolithography and etching. Using the Au patterns as masks, wet system etching was conducted to a depth of 10 μm to form a tapered base portion. Then, the above substrate 15 having Au patterns was placed in a reaction tube 16 placed in a tubular furnace 14 of resistance heating type having a temperature distribution as shown in FIG. 6. At the upstream side of this substrate, a quartz boat 17 containing polycrystals of $LaB_6$ 18 was placed. To the reaction tube, hydrogen gas was introduced, and the temperature was raised. The temperature distribution of the electric furnace was preliminarily set so that the temperature would be 1,000° C. at the position where the boat containing the $LaB_6$ polycrystals was placed, and the temperature would be 1,100° C. at the position where the $LaB_6$ single crystal substrate was placed.

When the temperature reached the prescribed levels, a gas mixture 19 of hydrogen and $BBr_3$ was introduced. The $LaB_6$ polycrystals placed at the low temperature portion were transported in the form of a bromide compound vapor to the high temperature portion. The transported La and B were taken into droplets of Au formed on the $LaB_6$ single crystal substrate and further precipitate $LaB_6$ single crystals on the $LaB_6$ single crystal substrate perpendicularly to the substrate surface. After a predetermined period of time, the temperature was lowered, and the $LaB_6$ single crystal substrate was taken out and examined by a scanning electron microscope (2,000 magnifications), whereby each needle-like crystal formed was found to consist of a base portion, a needle-like single crystal portion and a forward metal layer portion and had a diameter of 10 μm and a height of 500 μm. The needle-like crystals were located at the positions of the Au patterns, and the respective needle-like single crystals had no fine needle-like crystals around them. Further, the positional dislocation was 1 μm at the maximum. No kinking was observed.

Au at the forward ends of the needle-like single crystals was removed by etching, and the forward ends of the needle-like single crystals were sharpened by electrolytic polishing. Further, since these needle-like single crystals were preliminarily designed to be arranged in a lattice form, the substrate was cut in a lattice form by electrical discharge processing so that each chip had one needle-like single crystal, to obtain $LaB_6$ single crystal chips for hot cathodes.

Comparative Example 1

The operation was conducted in the same manner as in Example 1 except that no etching treatment to the depth of 10 μm of the Si single crystal of the substrate was conducted. As a result of the scanning electron microscope observation (2,000 magnifications), many needle-like single crystals were observed to have their centers dislocated by about 20 μm from the centers of the respective Au patterns. Further, a fusion phenomenon was observed in which a plurality of patterns fused into a single pattern, since the adjacent Au patterns were in contact during the formation of the Au—Si alloy. Further, a number of kinking and branching were observed.

Comparative Example 2

The operation was conducted in the same manner as in Example 4 except that no etching treatment to the depth of 10 μm of the $LaB_6$ single crystal of the substrate was conducted. As a result of the scanning electron microscope observation (2,000 magnifications), many needle-like single crystals were observed to have their centers dislocated by about 20 μm from the centers of the respective Au patterns. Further, a number of kinking and branching were observed.

As described in the foregoing, according to the present invention, it is possible to obtain patterned needle-like single crystals by growing the single crystals in correspondence to the desired patterns formed on a single crystal substrate. The needle-like single crystal of the present invention can be used as a probe pin for measuring the electrical characteristics of semiconductor integrated circuits, as a high quality $LaB_6$ single crystal useful for a high precision electron microscope or an electron exposure apparatus, or as a probe for a microvacuum device or a scanning probe microscope.

What is claimed is:

1. A method for producing a single crystal pin on a surface of a single crystal substrate, comprising the steps of:

(1) placing a metal layer pattern on a surface of a single crystal substrate;

(2) etching said surface of said single crystal substrate around said metal layer pattern; and (3) perpendicularly growing a single crystal pin on said single crystal substrate in a gas atmosphere containing an element or elements constituting said single crystal substrate.

2. The method of claim 1, wherein said perpendicularly growing is by vapor-liquid-solid growth.

3. The method of claim 1, wherein the crystal of said single crystal substrate and said single crystal pin is selected from the group consisting of Si, $LaB_6$, Ge, $\alpha\text{-}Al_2O_3$, GaAs, GaP, MgO, NiO and SiC.

4. The method of claim 3, wherein the crystal of said single crystal substrate and said single crystal pin is Si or $LaB_6$.

5. The method of claim 1, wherein said single crystal pin has a diameter of 1–300 microns and an aspect ratio of 1–500.

6. The method of claim 1, wherein said metal layer pattern has a center formed at an initial position on said single crystal substrate and wherein said perpendicularly growing step produces said single crystal pin having a positional dislocation from said center of at most 10 microns.

7. The method of claim 1, wherein said metal layer pattern has a circular, oval, rectangular or polygonal shape.

8. The method of claim 1, wherein said perpendicularly growing step produces a perpendicular single crystal pin, wherein said perpendicular single crystal pin forms an angle $\Theta$ with a line perpendicular to said single crystal substrate surface, and $\Theta$ at most 20°.

9. The method of claim 1, wherein said etching step is conducted to a depth of 1–100 microns.

10. The method of claim 1, wherein the metal of said metal layer pattern is selected from the group consisting of Au, Pt, Ag, Cu, Pd and Ga.

11. The method of claim 10, wherein said metal is selected from the group consisting of Au and Pt.

12. The method of claim 1, wherein said metal layer pattern has an aspect ratio from 0.01 to 10.

13. The method of claim 1, wherein said single crystal substrate has a single crystal layer on the surface thereof, said layer having a thickness of at least 3 microns.

14. The method of claim 1, wherein said placing step comprises placing a plurality of metal layer patterns on said single crystal substrate surface and said perpendicularly growing step produces a plurality of single crystal pins.

15. The method of claim 14, wherein the distance between centers of said plurality of single crystal pins is at least 5 microns.

16. A method for producing a single crystal pin on a substrate, said substrate having a single crystal layer with a thickness of at least 3 microns on the surface thereof, comprising the steps of:

(1) placing a metal layer pattern on the single crystal layer on said substrate;

(2) etching the surface of said single crystal layer; and (3) heating said metal layer pattern in a gas atmosphere containing an element or elements of said single crystal layer and perpendicularly growing a single crystal pin from said metal layer pattern to form a perpendicular single crystal pin, wherein said perpendicular single crystal pin forms an angle $\Theta$ with a line perpendicular to said single crystal substrate surface, and $\Theta$ is at most 20°.

17. The method of claim 16, wherein said single crystal layer is a crystal selected from the group consisting of Si, $LaB_6$, Ge, $\alpha\text{-}Al_2O_3$, GaAs, GaP, MgO, NiO and SiC, and said metal is selected from the group consisting of Au, Pt, Ag, Cu, Pd and Ga.

18. The method of claim 17, wherein said crystal of said single crystal layer is Si and said metal is selected from the group consisting of Au and Pt.

19. The method of claim 18, wherein said etching step comprises etching said single crystal surface to a depth of 1–100 microns to form a tapered single crystal substrate portion having a base in contact with said single crystal substrate surface, said base having diameter D, and a portion in contact with said metal layer pattern, said metal layer pattern contacting portion having diameter d, wherein diameter D is greater than diameter d.

* * * * *

UNITED STATES PATENT AND TRADEMARK OFFICE
CERTIFICATE OF CORRECTION

PATENT NO. : 5,544,617
DATED : August 13, 1996
INVENTOR(S) : Yoshinori TERUI, et al.

It is certified that error appears in the above-identified patent and that said Letters Patent is hereby corrected as shown below:

Column 1, line 5, "continuation" should read --division--.

Column 2, line 52, "3(b)" should read --3(c)--;
         line 54, "4(b)" should read --4(e)--.

Column 3, line 1, "a,thin" should read --a thin--;
         line 20, "angle $\ominus$ of" should read --angle $\ominus$ of--.

Column 5, line 57, "f" should read --of--.

Column 7, line 50, "AU" should read --Au--.

Signed and Sealed this

Twenty-first Day of October 1997

BRUCE LEHMAN

*Attest:*

*Attesting Officer*     *Commissioner of Patents and Trademarks*